(12) United States Patent
Kadota

(10) Patent No.: US 6,317,014 B1
(45) Date of Patent: Nov. 13, 2001

(54) SURFACE ACOUSTIC WAVE RESONATOR, FILTER, DUPLEXER AND COMMUNICATION DEVICE UTILIZING A SHEAR HORIZONTAL WAVE ON LANGASITE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/374,076

(22) Filed: Aug. 12, 1999

(30) Foreign Application Priority Data

Aug. 21, 1998 (JP) ................................................. 10-235772

(51) Int. Cl.[7] .............................. H03H 9/72; H03H 9/64; H03H 9/25
(52) U.S. Cl. ..................... 333/133; 333/193; 310/313 A; 310/360
(58) Field of Search ........................... 333/133, 193–196; 310/313 A, 360

(56) References Cited

U.S. PATENT DOCUMENTS

| | | | |
|---|---|---|---|
| 4,965,479 | * 10/1990 | Elliott et al. | 333/195 X |
| 5,793,147 | * 8/1998 | Kadota et al. | 310/313 R |
| 5,917,265 | * 6/1999 | Naumenko et al. | 310/313 A |
| 5,952,899 | * 9/1999 | Kadota et al. | 333/133 X |
| 5,986,523 | * 11/1999 | Morozumi et al. | 333/194 |
| 5,998,907 | * 12/1999 | Taguchi et al. | 310/313 R |
| 6,150,900 | * 11/2000 | Kadota et al. | 333/133 |
| 6,153,961 | * 11/2000 | Jian et al. | 310/313 A |

FOREIGN PATENT DOCUMENTS

| | | |
|---|---|---|
| 0 874 455 | 10/1998 | (EP) . |
| 2 287 580 | 9/1995 | (GB) . |
| 10-190407 | * 7/1998 | (JP) . |
| 97/25776 | 7/1997 | (WO) . |
| 97/49182 | 12/1997 | (WO) . |

OTHER PUBLICATIONS

Victor P. Plessky et al; "Surface Transverse Waves on Langasite", *1998 IEEE Ultrasonics Symposium*; vol. 1, pp. 139–142; October 1998.*
J. Koskela et al., Applied Physics Letters, "Surface Tranverse Waves on Langasite," vol. 72, No. 21, May 1998.
I.B. Yankovkin et al., IEEE Ultrasonics Symposium, "Numerical and Experimental Investigation SAW in Langasite," November 1995.
N.F. Naumenko, Soviet Physics Crystallography, "SAW and leaky Waves in a New Piezoelectric Crystal of Langasite," vol. 37, p. 979, May 1994.

* cited by examiner

Primary Examiner—Robert Pascal
Assistant Examiner—Barbara Summons
(74) Attorney, Agent, or Firm—Keating & Bennett, LLP

(57) ABSTRACT

A surface acoustic wave resonator includes a piezoelectric substrate including a langasite single crystal material and at least one interdigital transducer having at least one pair of comb-shaped electrodes arranged so as to contact the piezoelectric substrate. The surface acoustic wave resonator operates using a surface acoustic wave including an SH wave as the main component.

16 Claims, 3 Drawing Sheets

SURFACE ACOUSTIC WAVE RESONATOR, FILTER, DUPLEXER AND COMMUNICATION DEVICE UTILIZING A SHEAR HORIZONTAL WAVE ON LANGASITE

BACKGROUND OF THE INVENTION

1. Field of the Invention

The present invention relates to a surface acoustic wave resonator, a surface acoustic wave filter, a duplexer, and a communications apparatus including the same. More particularly, the present invention relates to a surface acoustic wave resonator using a surface acoustic wave including an SH wave as the main component.

2. Description of the Related Art

Conventionally, surface acoustic wave resonators have been used widely in band pass filters and other electronic components included in mobile communications equipment. As an example of such a surface acoustic wave resonator, a surface acoustic wave resonator or a surface acoustic wave filter having a configuration wherein an interdigital transducer (hereinafter referred to as IDT) including a comb-shaped electrode is formed on a piezoelectric substrate is well known. Since a surface acoustic wave including an SH wave as the main component, such as a Love wave, a leaky wave, a BGS wave, or the like can utilize edge reflection in such a surface acoustic wave resonator or surface acoustic wave filter, it is used practically in a small size resonator or surface acoustic wave filter, which does not require a reflector. Further, a piezoelectric single crystal, such as lithium niobate, lithium tantalate, or the like, is used as the material for the piezoelectric substrate of a surface acoustic wave resonator or a surface acoustic wave filter. In order to generate a surface acoustic wave including an SH wave as the main component, a 41° Y cut X propagation substrate or a 64° Y cut X propagation substrate needs to be used in the case of a lithium niobate, and a 36° Y cut X propagation substrate needs to be used in the case of a lithium tantalate. The 41° Y cut X propagation corresponds with the Euler angle indication of (0°, 131°, 0°), the 64° Y cut X propagation corresponds with the Euler angle indication of (0°, 154°, 0°), and the 36° Y cut X propagation corresponds with the Euler angle indication of (0°, 126°, 0°).

However, the temperature coefficient of group delay time temperature characteristic (hereinafter referred to as TCD) of these piezoelectric single crystals is not good. More specifically, the TCD of a 41° Y cut X propagation lithium niobate substrate is 80 ppm/° C., the TCD of a 64° Y cut X propagation lithium niobate substrate is 81 ppm/° C., and the TCD of a 36° Y cut X propagation lithium tantalate substrate is 32 ppm/° C.

In general, in order to reliably obtain good characteristics in a surface acoustic wave resonator, a material with a good TCD is needed. That is, a material with a small frequency characteristic change according to the temperature change is needed. Therefore, if a surface acoustic wave resonator for generating a surface acoustic wave including an SH wave as the main component is provided with the lithium niobate or the lithium tantalate used as the substrate material as mentioned above, a problem arises in that the frequency characteristic shifts drastically. Moreover, even though lithium tantalate has a TCD which is better than that of lithium niobate, it also experiences the same problem with the frequency characteristic shift.

For example, in a surface acoustic wave resonator having a 100 MHz center frequency, a 50° C. temperature change causes a 400 KHz frequency characteristic shift in the case of a 41° Y cut X propagation lithium niobate substrate, a 405 KHz frequency characteristic shift is generated in the case of a 64° Y cut X propagation lithium niobate substrate, and a 160 KHz frequency characteristic shift is generated in the case of a 36° Y cut X propagation lithium tantalate substrate.

In order to prevent such a frequency characteristic shift, a temperature compensation circuit has been connected to a surface acoustic wave resonator. However, a problem arises in that the device as a whole including the surface acoustic wave resonator becomes bulky because of the added temperature compensation circuit so that it is difficult to achieve a small size component.

SUMMARY OF THE INVENTION

In view of the problems described above, preferred embodiments of the present invention provide a surface acoustic wave resonator which operates using an SH wave as the main component and has an excellent TCD.

According to one preferred embodiment of the present invention, a surface acoustic wave resonator includes a piezoelectric substrate, and at least one interdigital transducer having at least one pair of comb-shaped electrodes arranged to contact the piezoelectric substrate, the resonator arranged to use a surface acoustic wave including an SH wave as the main component, wherein a langasite single crystal is used as the piezoelectric substrate.

Since the langasite single crystal is used as the piezoelectric substance and the SH wave is used as mentioned above, a surface acoustic wave resonator with a large degree of coupling is achieved.

The langasite single crystal preferably has the Euler angle (ø, θ, φ) of approximately $0°\leq ø \leq 30°$, $0°\leq θ \leq 25°$, and $φ=-1.07ø+90°±5°$, and more preferably, has the Euler angle (ø, θ, φ) of approximately $11°\leq ø \leq 24°$, and $17°\leq θ \leq 24°$.

Alternatively, the langasite single crystal preferably has the Euler angle (ø, θ, φ) of approximately $0°\leq ø \leq 30°$, $153°\leq θ \leq 180°$, and $φ=1.05ø+28°±5°$, and more preferably has the Euler angle (ø, θ, φ) of approximately $5°\leq ø \leq 30°$, and approximately $153°\leq θ \leq 158.5°$.

According to preferred embodiments of the present invention, a surface acoustic wave resonator has a TCD which is significantly better than that of a resonator having a lithium niobate substrate or a lithium tantalate substrate. With preferred embodiments of the present invention, it is possible to obtain a TCD value of $|10|$ ppm/° C. or less, and even $|5|$ ppm/° C. or less.

Moreover, since the sound velocity is low compared with other materials, a small size component can be achieved, and since the edge reflection of an SH wave can be utilized, a reflector is not required so that an even smaller size component can be achieved.

For the purpose of illustrating the invention, there is shown in the drawings several preferred embodiments which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
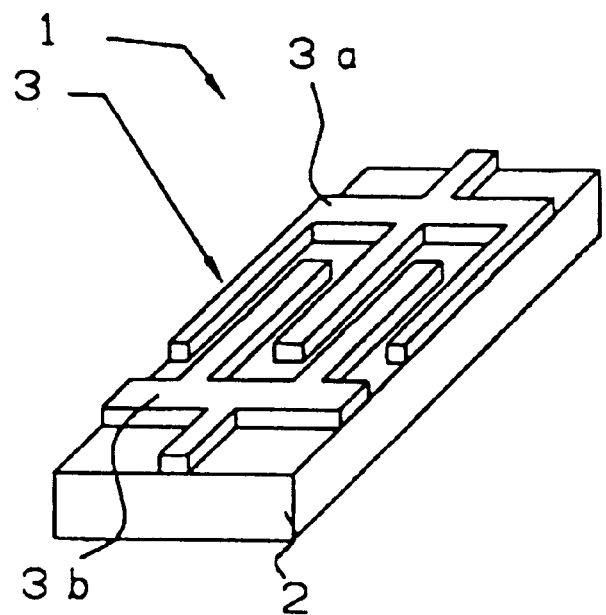
FIG. 1 is a perspective view of a surface acoustic wave resonator according to a first preferred embodiment of the present invention.

FIG. 1 is a perspective view of a surface acoustic wave resonator according to a first preferred embodiment of the present invention.

As shown in FIG. 1, a surface acoustic wave resonator 1 is provided by forming an interdigital transducer 3 on a piezoelectric substrate 2 made of a langasite single crystal ($La_3Ga_5SiO_{14}$).

The interdigital transducer 3 is preferably made of an electrode material, such as Al, Au, or the like such that a pair of comb-shaped electrodes 3a, 3b are arranged so as to be interdigitated with each other.

Figure 2:
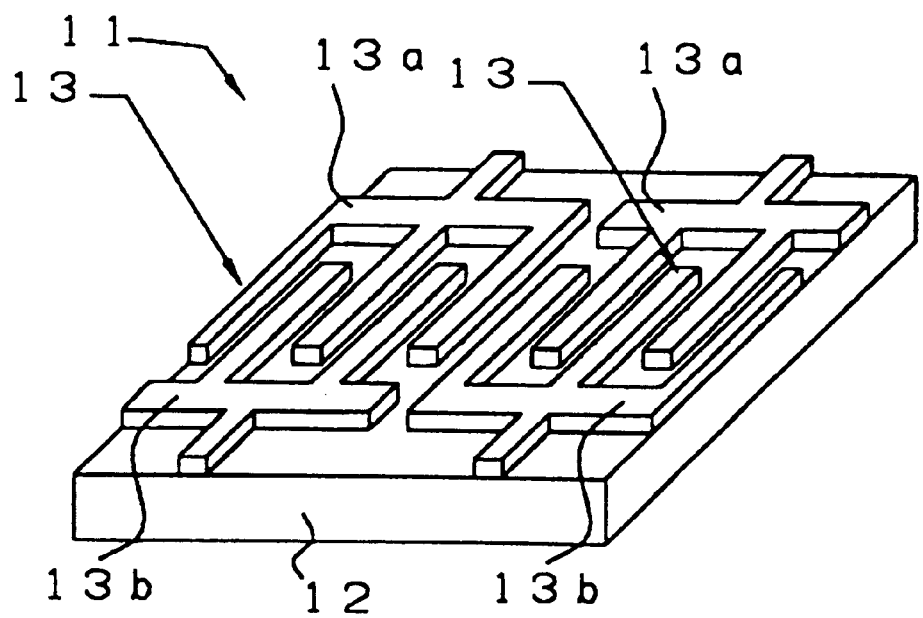
FIG. 2 is a perspective view of a longitudinally coupled surface acoustic wave filter according to a second preferred embodiment.

Then, a second preferred embodiment of the present invention will be explained. FIG. 2 is a perspective view of a longitudinally coupled surface acoustic wave filter according to a second preferred embodiment of the present invention.

As shown in FIG. 2, the longitudinally coupled surface acoustic wave filter 11 is provided by forming two interdigital transducers 13 on a piezoelectric substrate 12 made of a langasite single crystal ($La_3Ga_5SiO_{14}$).

The interdigital transducers 13 are formed with an electrode material, such as Al, Au, or the like such that a pair of comb-shaped electrodes 13a, 13b are arranged so as to be interdigitated with each other. Moreover, the interdigital transducers 13, 13 are arranged substantially parallel in the surface acoustic wave propagation direction with a certain distance.

Figure 3:
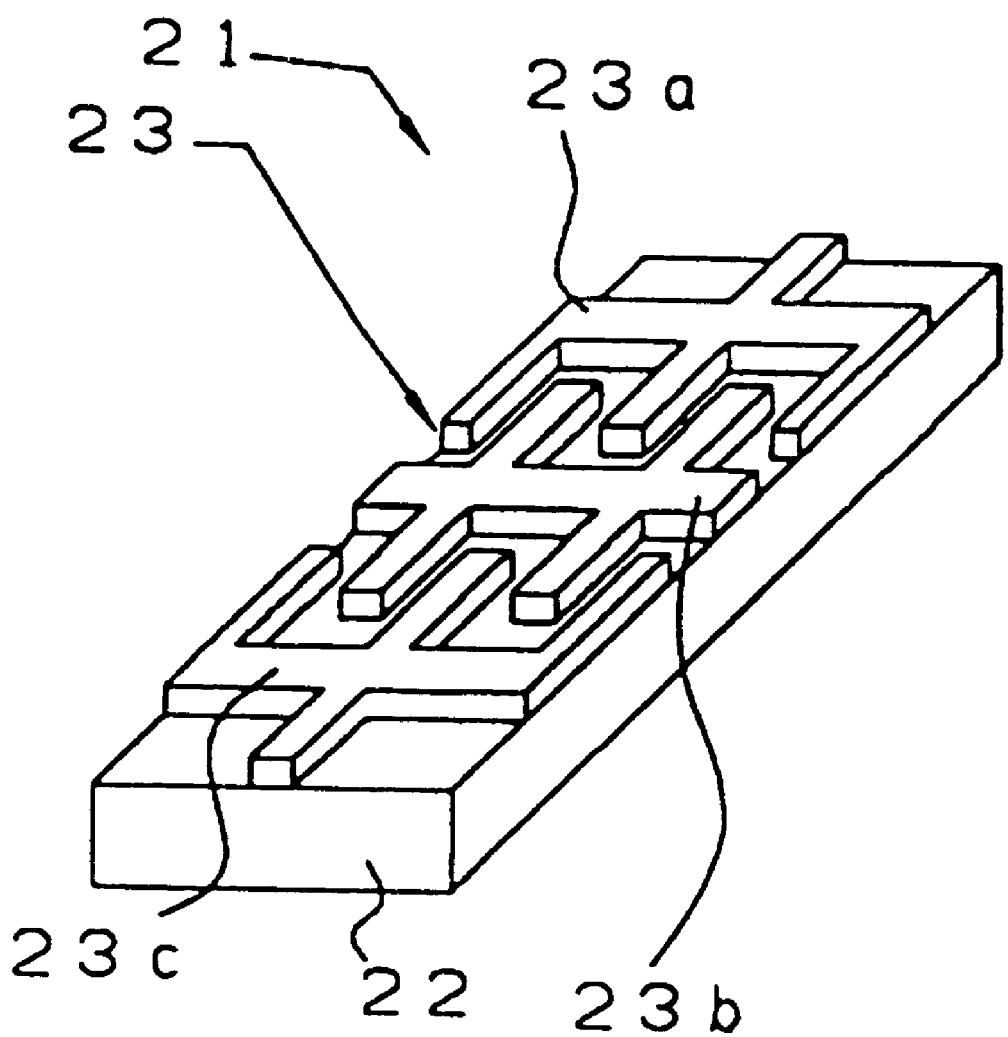
FIG. 3 is a perspective view of a laterally (i.e. transversally) coupled surface acoustic wave filter according to a third preferred embodiment.

Furthermore, a third preferred embodiment of the present invention will be explained. FIG. 3 is a perspective view of a laterally coupled surface acoustic wave filter according to a third preferred embodiment of the present invention.

As shown in FIG. 3, the transversally coupled surface acoustic wave filter 21 is provided by forming an interdigital transducer 23 on a piezoelectric substrate 22 made of a langasite single crystal ($La_3Ga_5SiO_{14}$).

The interdigital transducer 23 is preferably made of an electrode material, such as Al, Au, or the like such that pairs of comb-shaped electrodes 23a and 23b, 23b and 23c, are arranged so as to be interdigitated with each other.

Figure 4:
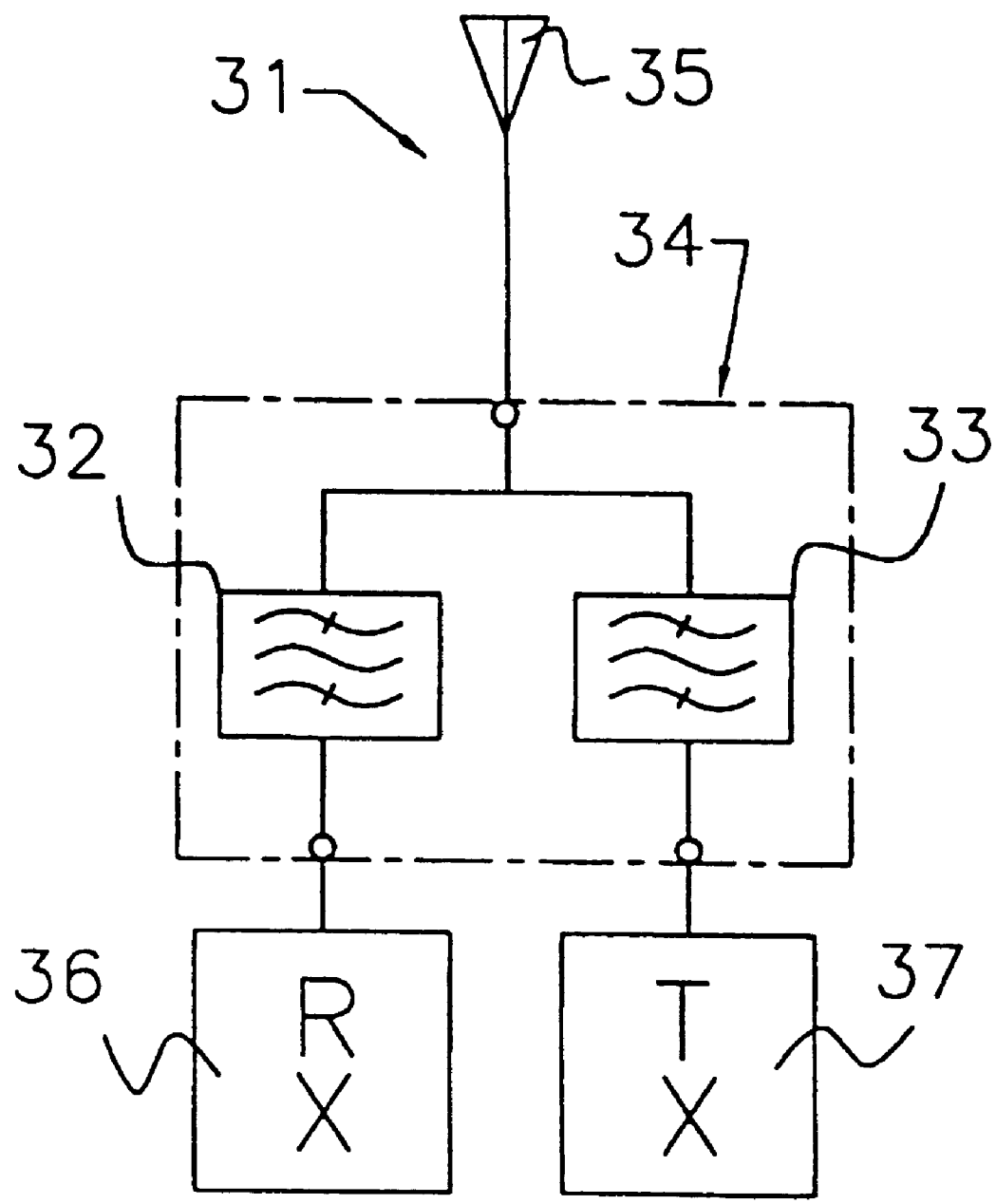
FIG. 4 is a block diagram for explaining a duplexer according to a fourth preferred embodiment and a communications apparatus according to a fifth preferred embodiment.

Then, fourth and fifth preferred embodiments of the present invention will be explained. FIG. 4 is a block diagram of a duplexer according to a fourth preferred embodiment of the present invention and a communications apparatus according to a fifth preferred embodiment of the present invention.

As shown in FIG. 4, the communications apparatus 31 is provided by connecting an antenna terminal of a duplexer 34 including a surface acoustic wave filter 32 for a receiver and a surface acoustic wave filter for a transmitter 33 with an antenna 35, connecting an output terminal with a receiving circuit 36, and connecting an input terminal with a transmitting circuit 37. For the receiving surface acoustic wave filter 32 and the transmitting surface acoustic wave filter 33 of the duplexer 34, the surface acoustic wave filters 11, 21 according to the second and third preferred embodiments are used.

Characteristics derived from a cutting angle of the material used for the substrate of the surface acoustic wave resonator used for the application mentioned above are shown in Table 1. Those marked with * before the specimen number are outside the range of preferred embodiments of the present invention.

P in the displacement distribution refers to a longitudinal wave, SH a transverse wave having a displacement in the horizontal direction, that is, an SH wave, and SV a transverse wave having a displacement in the vertical direction. Further, the displacement distribution is indicated with the largest wave as 1, and the other waves in the ratio with respect to the largest wave.

TABLE 1

| Specimen | | Euler angle | | | TCD | | Displacement distribution | | |
|---|---|---|---|---|---|---|---|---|---|
| Number | Material | φ | θ | ψ | (ppm/° C.) | K (%) | P | SH | SV |
| *1 | $LiNbO_3$ | 0.0 | 131.0 | 0.0 | 80.000 | 17.20 | 0.0300 | 1.00 | 0.4000 |
| *2 | $LiNbO_3$ | 0.0 | 154.0 | 0.0 | 81.000 | 11.30 | 0.1000 | 1.00 | 0.3700 |
| *3 | $LiTbO_3$ | 0.0 | 126.0 | 0.0 | 32.000 | 4.70 | 0.0300 | 1.00 | 0.1300 |
| 4 | $La_3Ga_5SiO_{14}$ | 0.0 | 0.0 | 85.0 | −16.000 | 2.30 | 0.1800 | 1.00 | 0.2800 |
| 5 | $La_3Ga_5SiO_{14}$ | 0.0 | 23.5 | 89.5 | −0.200 | 4.23 | 0.7400 | 0.21 | 0.9060 |
| *6 | $La_3Ga_5SiO_{14}$ | 0.0 | 25.0 | 89.5 | 25.345 | 2.15 | 0.8200 | 1.00 | 1.0000 |
| 7 | $La_3Ga_5SiO_{14}$ | 5.0 | 22.0 | 84.0 | 5.970 | 3.73 | 0.2000 | 1.00 | 0.2400 |
| 8 | $La_3Ga_5SiO_{14}$ | 10.0 | 0.0 | 80.0 | 16.700 | 3.01 | 0.0059 | 1.00 | 0.0100 |
| 9 | $La_3Ga_5SiO_{14}$ | 10.0 | 10.0 | 79.5 | 5.270 | 3.77 | 0.0480 | 1.00 | 0.0699 |
| 10 | $La_3Ga_5SiO_{14}$ | 10.0 | 20.0 | 79.0 | −8.651 | 4.80 | 0.3100 | 1.00 | 0.3000 |
| 11 | $La_3Ga_5SiO_{14}$ | 10.0 | 22.0 | 79.0 | 5.990 | 4.44 | 0.3700 | 1.00 | 0.4600 |
| 12 | $La_3Ga_5SiO_{14}$ | 10.0 | 23.0 | 79.0 | 2.740 | 4.71 | 0.5700 | 1.00 | 0.7100 |
| 13 | $La_3Ga_5SiO_{14}$ | 10.0 | 24.0 | 79.0 | −5.490 | 4.69 | 0.7200 | 1.00 | 0.9800 |
| *14 | $La_3Ga_5SiO_{14}$ | 10.0 | 25.0 | 79.0 | −8.360 | 4.66 | 0.8100 | 0.62 | 1.0000 |
| 15 | $La_3Ga_5SiO_{14}$ | 11.0 | 17.0 | 78.5 | 0.064 | 4.57 | 0.2100 | 1.00 | 0.2800 |
| 16 | $La_3Ga_5SiO_{14}$ | 12.0 | 17.0 | 77.5 | −0.110 | 4.72 | 0.2400 | 1.00 | 0.3150 |
| 17 | $La_3Ga_5SiO_{14}$ | 14.5 | 15.0 | 75.0 | 1.159 | 4.72 | 0.2100 | 1.00 | 0.2920 |
| 18 | $La_3Ga_5SiO_{14}$ | 14.5 | 16.0 | 75.0 | 0.610 | 4.89 | 0.2500 | 1.00 | 0.3400 |
| 19 | $La_3Ga_5SiO_{14}$ | 14.5 | 17.0 | 74.5 | 0.067 | 4.58 | 0.2100 | 1.00 | 0.2750 |
| 20 | $La_3Ga_5SiO_{14}$ | 14.5 | 18.0 | 74.5 | −0.300 | 4.74 | 0.2500 | 1.00 | 0.3320 |

TABLE 1-continued

| Specimen | | Euler angle | | | TCD | | Displacement distribution | | |
|---|---|---|---|---|---|---|---|---|---|
| Number | Material | φ | θ | ψ | (ppm/° C.) | K (%) | P | SH | SV |
| 21 | $La_3Ga_5SiO_{14}$ | 14.5 | 19.0 | 74.5 | −0.830 | 4.93 | 0.3100 | 1.00 | 0.4080 |
| 22 | $La_3Ga_5SiO_{14}$ | 14.5 | 20.0 | 74.5 | −1.520 | 5.14 | 0.4000 | 1.00 | 0.5110 |
| 23 | $La_3Ga_5SiO_{14}$ | 14.5 | 23.0 | 74.0 | −7.450 | 5.19 | 0.8000 | 1.00 | 0.9900 |
| *24 | $La_3Ga_5SiO_{14}$ | 14.5 | 25.0 | 73.0 | −29.910 | 2.66 | 0.8100 | 0.23 | 1.0000 |
| 25 | $La_3Ga_5SiO_{14}$ | 15.0 | 17.0 | 74.0 | 0.068 | 4.65 | 0.2200 | 1.00 | 0.2920 |
| 26 | $La_3Ga_5SiO_{14}$ | 20.0 | 0.0 | 69.9 | 8.860 | 3.01 | 0.0059 | 1.00 | 0.0100 |
| 27 | $La_3Ga_5SiO_{14}$ | 20.0 | 10.0 | 69.5 | 5.650 | 4.23 | 0.1300 | 1.00 | 0.1980 |
| 28 | $La_3Ga_5SiO_{14}$ | 20.0 | 18.0 | 68.5 | −0.290 | 5.07 | 0.3000 | 1.00 | 0.4000 |
| 29 | $La_3Ga_5SiO_{14}$ | 20.0 | 20.0 | 68.5 | −2.030 | 5.51 | 0.4600 | 1.00 | 0.5980 |
| 30 | $La_3Ga_5SiO_{14}$ | 20.0 | 23.0 | 68.0 | −8.330 | 5.59 | 0.7900 | 1.00 | 0.9900 |
| *31 | $La_3Ga_5SiO_{14}$ | 20.0 | 30.0 | 67.0 | −23.400 | 2.75 | 0.8200 | 0.24 | 1.0000 |
| 32 | $La_3Ga_5SiO_{14}$ | 24.0 | 17.0 | 64.5 | 0.260 | 5.12 | 0.2900 | 1.00 | 0.4460 |
| 33 | $La_3Ga_5SiO_{14}$ | 24.0 | 24.0 | 63.0 | 1.080 | 5.37 | 0.7700 | 1.00 | 0.9620 |
| *34 | $La_3Ga_5SiO_{14}$ | 24.0 | 25.0 | 63.0 | −6.050 | 5.38 | 0.8100 | 0.70 | 1.0000 |
| 35 | $La_3Ga_5SiO_{14}$ | 30.0 | 0.0 | 59.0 | 13.240 | 3.91 | 0.6100 | 1.00 | 0.1030 |
| 36 | $La_3Ga_5SiO_{14}$ | 30.0 | 10.0 | 59.0 | −5.800 | 3.82 | 0.1600 | 1.00 | 0.2390 |
| 37 | $La_3Ga_5SiO_{14}$ | 30.0 | 20.0 | 57.5 | −1.850 | 5.88 | 0.5000 | 1.00 | 0.6540 |
| 38 | $La_3Ga_5SiO_{14}$ | 30.0 | 23.0 | 57.0 | −3.800 | 6.01 | 0.7200 | 1.00 | 0.9200 |
| 39 | $La_3Ga_5SiO_{14}$ | 30.0 | 25.0 | 56.5 | 2.148 | 5.87 | 0.8000 | 0.81 | 1.0000 |
| *40 | $La_3Ga_5SiO_{14}$ | 31.0 | 0.0 | 5.90 | 14.025 | 4.02 | 1.0000 | 0.90 | 0.0930 |
| *41 | $La_3Ga_5SiO_{14}$ | 31.0 | 25.0 | 56.5 | 2.345 | 5.96 | 0.8200 | 0.79 | 1.0000 |

As shown in Table 1, when a langasite single crystal ($La_3Ga_5SiO_{14}$) is used to form the substrate, the TCD is improved dramatically compared with a conventional lithium niobate substrate, and is also greatly improved compared with a lithium tantalate substrate.

Moreover, as seen in Table 1, in the surface acoustic wave resonators using a langasite single crystal ($La_3Ga_5SiO_{14}$), a displacement distribution SH 1 can be found, that is, the SH wave can be the largest there. Thus, it was discovered that the SH wave can be utilized very effectively.

More specifically, from Table 1, it is seen that the displacement distribution SH can be 1 within the range wherein the Euler angle (ø, θ, φ) is (0°≦ø≦30°, 0°≦θ≦25°, and φ=−1.07ø+90°±5°), that is, within the range of the specimen numbers 4, 5, 7 to 13, 15 to 23, 25 to 30, 32, 33, and 35 to 39. φ=−1.07ø+90°±5° is the formula determined from the experimental values of the specimens shown in Table 1.

Furthermore, as shown in Table 1, it is discovered that in a langasite single crystal ($La_3Ga_5SiO_{14}$), since the TCD value is about |10| ppm/° C. or less within the range wherein the Euler angle thereof is about (11°≦ø≦24°, and 17°≦θ≦24°), that is, within the range of the specimen numbers 15 to 23, 25 to 30, 32 and 33, the TCD is particularly good compared with the other parts in Table 1.

Therefore, by using a langasite single crystal ($La_3Ga_5SiO_{14}$) with the Euler angle in the piezoelectric substrates 2, 12, 22 of the surface acoustic wave resonator shown in FIG. 1 and the surface acoustic wave filters shown in FIGS. 2, 3, since the TCD is |10| ppm/° C. or less, for example, in the case of a surface acoustic wave resonator having a 100 MHz center frequency, only about 50 KHz frequency characteristic shift is generated by a 50° C. temperature change. Thus, this device is constructed to easily withstand use in an environment with a large temperature change.

Characteristics derived from a cutting angle different from those of Table 1 of the material used for the substrate of the surface acoustic wave resonator are shown in Table 2. Items marked with * before the specimen number are outside the range of preferred embodiments of the present invention. As in Table 1, P in the displacement distribution refers to a longitudinal wave, SH a transverse wave having a displacement in the horizontal direction, that is, an SH wave, and SV a transverse wave having a displacement in the vertical direction. Further, the displacement distribution is indicated with the largest wave as 1, and the other waves in the ratio with respect to the largest wave.

TABLE 2

| Specimen | | Euler angle | | | TCD | | Displacement distribution | | |
|---|---|---|---|---|---|---|---|---|---|
| Number | Material | φ | θ | ψ | (ppm/° C.) | K (%) | P | SH | SV |
| *42 | $La_3Ga_5SiO_{14}$ | 0.0 | 153.0 | 24.5 | −11.851 | 6.98 | 0.7300 | 0.90 | 1.0000 |
| 43 | $La_3Ga_5SiO_{14}$ | 0.0 | 154.0 | 23.0 | −9.673 | 6.82 | 0.7000 | 1.00 | 0.9200 |
| 44 | $La_3Ga_5SiO_{14}$ | 0.0 | 158.5 | 25.5 | 2.550 | 6.66 | 0.5900 | 1.00 | 0.8380 |
| 45 | $La_3Ga_5SiO_{14}$ | 0.0 | 165.0 | 27.0 | −22.489 | 5.88 | 0.3700 | 1.00 | 0.5580 |
| 46 | $La_3Ga_5SiO_{14}$ | 0.0 | 170.0 | 28.5 | −25.604 | 5.09 | 0.2500 | 1.00 | 0.3940 |
| 47 | $La_3Ga_5SiO_{14}$ | 0.0 | 180.0 | 29.5 | −30.532 | 4.89 | 0.4600 | 1.00 | 0.8300 |
| *48 | $La_3Ga_5SiO_{14}$ | 0.0 | 181.0 | 29.5 | −31.210 | 4.77 | 0.6300 | 0.95 | 1.0000 |
| 49 | $La_3Ga_5SiO_{14}$ | 5.0 | 158.0 | 30.5 | 0.897 | 6.67 | 0.6000 | 1.00 | 0.8400 |
| 50 | $La_3Ga_5SiO_{14}$ | 5.0 | 158.5 | 31.0 | 0.900 | 6.69 | 0.6300 | 1.00 | 0.8860 |
| *51 | $La_3Ga_5SiO_{14}$ | 10.0 | 140.0 | 39.5 | −6.250 | 4.68 | 0.8100 | 0.32 | 1.0000 |
| *52 | $La_3Ga_5SiO_{14}$ | 10.0 | 150.0 | 34.0 | 1.940 | 6.77 | 0.7800 | 0.72 | 1.0000 |
| 53 | $La_3Ga_5SiO_{14}$ | 10.0 | 153.0 | 34.5 | −1.820 | 6.89 | 0.7700 | 1.00 | 1.0000 |

TABLE 2-continued

| Specimen Number | Material | Euler angle ϕ | θ | ψ | TCD (ppm/° C.) | K (%) | Displacement distribution P | SH | SV |
|---|---|---|---|---|---|---|---|---|---|
| 54 | $La_3Ga_5SiO_{14}$ | 10.0 | 155.0 | 35.0 | −1.470 | 6.80 | 0.7300 | 1.00 | 0.9620 |
| 55 | $La_3Ga_5SiO_{14}$ | 10.0 | 158.5 | 36.0 | −0.210 | 6.61 | 0.6100 | 1.00 | 0.8400 |
| 56 | $La_3Ga_5SiO_{14}$ | 10.0 | 160.0 | 36.5 | 14.960 | 6.48 | 0.5700 | 1.00 | 0.7940 |
| *57 | $La_3Ga_5SiO_{14}$ | 20.0 | 145.0 | 47.0 | −12.120 | 4.46 | 0.8100 | 0.37 | 1.0000 |
| *58 | $La_3Ga_5SiO_{14}$ | 20.0 | 150.0 | 44.0 | −6.970 | 6.00 | 0.8100 | 0.70 | 1.0000 |
| 59 | $La_3Ga_5SiO_{14}$ | 20.0 | 160.0 | 47.0 | 12.190 | 6.28 | 0.5600 | 1.00 | 0.7500 |
| *60 | $La_3Ga_5SiO_{14}$ | 25.0 | 150.0 | 48.5 | −12.070 | 5.43 | 0.8100 | 0.58 | 1.0000 |
| 61 | $La_3Ga_5SiO_{14}$ | 25.0 | 153.0 | 50.0 | 1.455 | 5.91 | 0.8100 | 1.00 | 1.0000 |
| 62 | $La_3Ga_5SiO_{14}$ | 25.0 | 154.0 | 50.5 | 0.091 | 6.04 | 0.8000 | 1.00 | 1.0000 |
| 63 | $La_3Ga_5SiO_{14}$ | 25.0 | 155.0 | 51.0 | 1.480 | 6.16 | 0.7900 | 1.00 | 1.0000 |
| 64 | $La_3Ga_5SiO_{14}$ | 30.0 | 158.5 | 57.5 | −3.070 | 5.74 | 0.5600 | 1.00 | 0.7160 |
| 65 | $La_3Ga_5SiO_{14}$ | 30.0 | 165.0 | 58.5 | −19.524 | 5.39 | 0.3100 | 1.00 | 0.4320 |
| 66 | $La_3Ga_5SiO_{14}$ | 30.0 | 170.0 | 59.0 | −22.425 | 4.42 | 0.1600 | 1.00 | 0.2420 |
| 67 | $La_3Ga_5SiO_{14}$ | 30.0 | 180.0 | 60.0 | −36.780 | 3.38 | 0.5900 | 1.00 | 0.8500 |
| *68 | $La_3Ga_5SiO_{14}$ | 30.0 | 181.0 | 61.0 | −39.185 | 3.35 | 0.6100 | 0.90 | 1.0000 |

As shown in Table 2, when a langasite single crystal ($La_3Ga_5SiO_{14}$) is used to form the substrate, the TCD is improved dramatically compared with a conventional lithium niobate substrate, and is also improved compared with a lithium tantalate substrate.

Moreover, as seen in Table 2, in the surface acoustic wave resonators using a langasite single crystal ($La_3Ga_5SiO_{14}$), a displacement distribution SH 1 can be found, that is, the SH wave can be the largest there. Thus, it was discovered that the SH wave can be utilized very effectively.

Moreover, from Table 2, it is discovered that the displacement distribution SH can be 1 within the range wherein the Euler angle (ø, θ, ϕ) is (0°≦ø≦30°, 153°≦θ≦180°, and ϕ=1.05ø+28°±5°), that is, within the range of the specimen numbers 43 to 47, 49, 50, 53 to 56, 59, and 61 to 67. ϕ=1.05ø+28°±5° is the formula found out from the experiment values of the specimens shown in Table 2.

Furthermore, as shown in Table 2, in a langasite single crystal ($La_3Ga_5SiO_{14}$), since the TCD value is about |5| ppm/° C. or less within the range wherein the Euler angle thereof is about (5°≦ø≦30°, and 153°≦θ≦158.5°), that is, within the range of the specimen numbers 49, 50, 53 to 55, and 61 to 64, it is learned that the TCD is particularly good compared with the other parts in Tables 1 and 2.

Therefore, by using a langasite single crystal ($La_3Ga_5SiO_{14}$) with the Euler angle in the piezoelectric substrates 2, 12, 22 of the surface acoustic wave resonator shown in FIG. 1 and the surface acoustic wave filters shown in FIGS. 2, 3, since the TCD is |5| ppm/° C. or less, for example, in the case of a surface acoustic wave resonator having a 100 MHz center frequency, only about 25 KHz frequency characteristic shift is generated by a 50° C. temperature change. Thus, such a device can easily withstand use in an environment with a large temperature change.

Although examples of a surface acoustic wave resonator, a longitudinally coupled surface acoustic wave filter, and a transversally coupled surface acoustic wave filter have been explained in the first to third preferred embodiments of the present invention, the present invention is not limited thereto. For example, a transversally coupled surface acoustic wave filter having plural sets of interdigital transducers, or a surface acoustic wave resonator to be used in a ladder type filter with surface acoustic wave resonators arranged like a ladder, or the like, can be adopted, and the same effect can be obtained in a surface acoustic wave resonator with any kind of structure.

Furthermore, although surface acoustic wave resonators without a reflector have been explained in the first to third preferred embodiments of the present invention, the present invention is not limited thereto, but can be adopted in a surface acoustic wave resonator having a reflector.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave resonator comprising:
   a piezoelectric substrate including a langasite single crystal;
   at least one interdigital transducer having at least one pair of comb-shaped electrodes arranged so as to contact the piezoelectric substrate; wherein
   the surface acoustic wave resonator is constructed to operate using one of a Love wave, a leaky wave and a BGS wave as the main component and an edge reflection of the piezoelectric substrate.

2. The surface acoustic wave resonator according to claim 1, wherein the langasite single crystal has the Euler angle (ø, θ, ϕ) in the range of:

0°≦ø≦30°,

0°≦θ≦25°, and

ϕ=−1.07ø+90°±5°.

3. A surface acoustic wave filter comprising at least one surface acoustic wave resonator according to claim 1.

4. A communications apparatus comprising at least one surface acoustic wave filter defined by claim 3.

5. A communications apparatus comprising at least one surface acoustic wave resonator defined by claim 1.

6. A surface acoustic wave resonator comprising:
   a piezoelectric substrate including a langasite single crystal;
   at least one interdigital transducer having at least one pair of comb-shaped electrodes arranged so as to contact the piezoelectric substrate; wherein
   the surface acoustic wave resonator is constructed to operate using a surface acoustic wave including a shear horizontal wave as the main component; and the langasite single crystal has the Euler angle (ø, θ, φ) in the range of:

$11° \leq ø \leq 24°$, $17° \leq θ \leq 24°$, and $φ = -1.07ø + 90° \pm 5°$.

7. A duplexer comprising at least one surface acoustic wave resonator including:
- a piezoelectric substrate including a langasite single crystal;
- at least one interdigital transducer having at least one pair of comb-shaped electrodes arranged so as to contact the piezoelectric substrate; wherein
- the surface acoustic wave resonator is constructed to operate using a surface acoustic wave including a shear horizontal wave as the main component.

8. A communications apparatus comprising the duplexer of claim 7.

9. A surface acoustic wave resonator comprising:
- a piezoelectric substrate including a langasite single crystal;
- at least one interdigital transducer having at least one pair of comb-shaped electrodes arranged so as to contact the piezoelectric substrate; wherein
- the surface acoustic wave resonator is constructed to operate using a surface acoustic wave including a shear horizontal wave as the main component; and
- the langasite single crystal has the Euler angle (ø, θ, φ) in the range of:

$0° \leq ø \leq 30°$, $153° \leq θ \leq 180°$, and $φ = 1.05ø + 28° \pm 5°$.

10. The surface acoustic wave resonator according to claim 9, wherein the langasite single crystal has the Euler angle (ø, θ, φ) in the range of:

$5° \leq ø \leq 30°$, and $153° \leq θ \leq 158.5°$.

11. A duplexer comprising at least one surface acoustic wave filter which includes at least one surface acoustic wave resonator comprising:
- a piezoelectric substrate including a langasite single crystal;
- at least one interdigital transducer having at least one pair of comb-shaped electrodes arranged so as to contact the piezoelectric substrate; wherein
- the surface acoustic wave resonator is constructed to operate using a surface acoustic wave including a shear horizontal wave as the main component.

12. A transversally coupled surface acoustic wave filter comprising:
- a piezoelectric substrate including a langasite single crystal;
- two interdigital transducers each having a pair of comb-shaped electrodes arranged to contact the piezoelectric substrate;
- wherein the transversally coupled surface acoustic wave filter operates using one of a Love wave, a leaky wave and a BGS wave as the main component and an edge reflection of the piezoelectric substrate.

13. The transversally coupled surface acoustic wave filter according to claim 12, wherein the langasite single crystal has the Euler angle (ø, θ, φ) in the range of:

$11° \leq ø \leq 24°$, $17° \leq θ \leq 24°$, and $φ = -1.07ø + 90° \pm 5°$.

14. A transversally coupled surface acoustic wave filter comprising:
- a piezoelectric substrate including a langasite single crystal;
- two interdigital transducers each having a pair of comb-shaped electrodes arranged to contact the piezoelectric substrate;
- wherein the transversally coupled surface acoustic wave filter operates using a surface acoustic wave including a shear horizontal wave as the main component; and
- the langasite single crystal has the Euler angle (ø, θ, φ) in the range of:

$11° \leq ø \leq 24°$, $17° \leq θ \leq 24°$, and $φ = -1.07ø + 90° \pm 5°$.

15. A transversally coupled surface acoustic wave filter comprising:
- a piezoelectric substrate including a langasite single crystal;
- two interdigital transducers each having a pair of comb-shaped electrodes arranged to contact the piezoelectric substrate;
- wherein the transversally coupled surface acoustic wave filter operates using a surface acoustic wave including a shear horizontal wave as the main component; and
- the langasite single crystal has the Euler angle (ø, θ, φ) in the range of:

$0° \leq ø \leq 30°$, $153° \leq θ \leq 180°$, and $φ = 1.05ø + 28° \pm 5°$.

16. The transversally coupled surface acoustic wave filter according to claim 15, wherein the langasite single crystal has the Euler angle (ø, θ, φ) in the range of:

$5° \leq ø \leq 30°$, and $153° \leq θ \leq 158.5°$.

* * * * *